(12) United States Patent
Bortolus et al.

(10) Patent No.: US 8,476,859 B2
(45) Date of Patent: Jul. 2, 2013

(54) DC POWER FOR SGCT DEVICES USING A HIGH FREQUENCY CURRENT LOOP WITH MULTIPLE CURRENT TRANSFORMERS

(75) Inventors: Angelo Bortolus, Mississauga (CA); Bin Wu, Toronto (CA); Zhongyuan Cheng, Cambridge (CA); Jahangir Afsharian, Toronto (CA); Navid Zargari, Cambridge (CA); Vijay Khatri, Brampton (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 329 days.

(21) Appl. No.: 12/894,794

(22) Filed: Sep. 30, 2010

(65) Prior Publication Data

US 2012/0081058 A1 Apr. 5, 2012

(51) Int. Cl.
*H02P 27/06* (2006.01)
*H02K 11/00* (2006.01)

(52) U.S. Cl.
CPC .................................. *H02K 11/001* (2013.01)
USPC ........... 318/490; 318/494; 318/448; 318/508; 318/509; 318/510

(58) Field of Classification Search
CPC .................................................... H02K 11/001
USPC ................. 318/490, 494, 448, 508, 509, 510
See application file for complete search history.

(56) References Cited

U.S. PATENT DOCUMENTS

| | | | |
|---|---|---|---|
| 4,542,440 A | 9/1985 | Chetty et al. | |
| 4,804,900 A * | 2/1989 | Soeda | 318/719 |
| 5,424,937 A | 6/1995 | Lyotani et al. | |
| 5,483,192 A | 1/1996 | Tai | |
| 5,796,599 A | 8/1998 | Raonic et al. | |
| 5,982,646 A | 11/1999 | Lyons et al. | |
| 6,351,397 B1 | 2/2002 | Sawa et al. | |
| 6,366,483 B1 | 4/2002 | Ma et al. | |
| 6,396,672 B1 | 5/2002 | Deam | |
| 6,417,719 B1 | 7/2002 | Deam | |
| 6,493,242 B1 | 12/2002 | Riggio et al. | |
| 6,496,391 B1 | 12/2002 | Ikeda et al. | |
| 6,565,119 B2 * | 5/2003 | Fogle, Jr. | 280/735 |
| 6,710,994 B1 | 3/2004 | Deam | |
| 7,295,448 B2 * | 11/2007 | Zhu | 363/17 |
| 7,511,976 B2 | 3/2009 | Zargari et al. | |
| 7,576,451 B2 | 8/2009 | Maclennan et al. | |
| 7,791,884 B2 | 9/2010 | Huang et al. | |
| 2003/0103360 A1 | 6/2003 | Hatta et al. | |

(Continued)

OTHER PUBLICATIONS

Dusan M. Raonic, "SCR Self-Supplied Gate Driver for Medium-Voltage Application with Capacitor as Storage Element", IEEE Transaction on Industry Applications, vol. 36, No. 1, Jan./Feb. 2000.

(Continued)

*Primary Examiner* — Walter Benson
*Assistant Examiner* — David Luo
(74) *Attorney, Agent, or Firm* — Fay Sharpe LLP; Alexander Kuszewski; John M. Miller

(57) ABSTRACT

Motor drives and switch driver power systems are presented in which high frequency AC current ($I_{HF}$) is provided through one or more cables (202) magnetically coupled with local driver current transformers (240), and the transformer secondary currents are converted to provide DC power to switch drivers of an active power converter stage (110a, 110b) in the motor drive.

20 Claims, 5 Drawing Sheets

U.S. PATENT DOCUMENTS

2007/0152648 A1    7/2007  Gabello et al.
2007/0297202 A1   12/2007  Zargari et al.
2010/0201197 A1*   8/2010  Shires et al. .................... 307/73

OTHER PUBLICATIONS

Dusan M. Raonic, "SCR Self Supplied Gate Driver for Medium Voltage Application with Capacitor as Storage Element", IEEE Industry Applications Conference, Thirty-Third IAS Annual Meeting, Oct. 1998.

Power Integrations, "TOP242-250 TOPswitch-GX Family Application Notes", Nov. 2005.

B. Odegard, R. Ernst, "Applying IGCT Gate Units", ABB Application Note 5SYA 2031, Dec. 2002.

Dusan Raonic, Dave MacLennan, Didier Rouaud, "Some Experience with SCR's Self Powered Gate Driver System for Medium Voltage Solid State Starter", IEEE Canadian Conference on Electrical and Computer Engineering Conference (CCECE), Sr. John's, Newfoundland, Canada, May 25-28, 1997.

ABB Switzerland LTD, Semiconductors, "Current Source Power Supply", Jan. 2010.

"High Power Semiconductors Short Form Catalogue 2010", ABB Switzerland LTD.

* cited by examiner

DC POWER FOR SGCT DEVICES USING A HIGH FREQUENCY CURRENT LOOP WITH MULTIPLE CURRENT TRANSFORMERS

BACKGROUND

Motor drives and other forms power conversion systems convert electrical power from one form to another and may be employed in a variety of applications such as powering an electric motor using power converted from a single or multiphase AC input source, converting AC power from a wind driven generator to supply power to a grid, etc. Power converters may include multiple stages for different types of conversion applications, such as AC/DC/AC drives for electric motors having a pulse width modulated (PWM) active current source rectifier in which AC input power is selectively switched to create a DC output bus voltage from which a load is driven by a PWM controlled inverter stage. This type of converter is particularly useful in driving electric motors in industrial applications requiring variable speed control with varying motor load situations.

In the controlled switching of the input and output power in one or more converter stages, high voltages and currents are experienced by the power switches, wherein semiconductor-based switches such as silicon controlled rectifiers (SCRs), gate turn-off thyristors (GTOs), gate commutated thyristors (GCTs such as integrated gate commutated thyristors (IGCTs) or symmetrical gate commutated thyristors (SGCTs)), etc. are typically used to switch the power at relatively high frequencies. The control terminals or gates of these switching devices require gate driver circuits to generate the switch signals for actuating the power switch for controlled operation in power conversion applications, wherein GCTs typically have an external gate driver and IGCTs have a driver circuit integral to the GCT power switch. In medium or high voltage power converters, the gate driver circuit needs to be operated with power that is isolated from the system ground since the input and output voltages may be several thousand volts or more. Conventional power converters often employ separate isolated DC voltage sources for powering the gate driver circuits. However, these driver power sources and voltage transformers occupy valuable space and add significant cost in power conversion systems, particularly for medium or high voltage systems operated with GCT or IGCT type switches. Thus, there remains a need for improved power conversion systems and gate driver power sources by which isolated gate driver power can be provided in a cost efficient manner without adding large external power sources.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter. The present disclosure provides power to switch driver circuits to power SGCTs or other power converter switching devices using a high frequency current loop with local current transformers. Unlike driver power approaches using a potential transformer that must meet stringent corona specifications and are thus costly to manufacture, the present approach utilizes current transformers and a current loop for transferring energy to actuate the power switches, and facilitates use in high voltage applications since the isolation rating is achieved by insulation of the cable carrying the high frequency AC current rather than through high potential voltage transformers.

A motor drive is disclosed, which includes an input receiving AC input electrical power from a power source, an output providing AC output electrical power to a motor load, and one or more active power converter stages (e.g., rectifier, inverter, etc.). The converter stage includes switch circuits that individually comprise a switching device (e.g., GCTs, IGBTs, MOSFETs, etc.) and a switch driver operating the switch control terminal according to a corresponding switching control signal. The drive also includes a plurality of driver supply circuits individually associated with a corresponding switch circuit or a group of switch circuits. The individual driver supply circuits include an AC driver supply input to receive high frequency AC input current, as well as a DC driver supply output to power the switch driver and an AC-DC converter circuit to convert the high frequency AC input current to provide DC output power to the DC driver supply output. Current transformers are provided with a secondary winding coupled to provide input current to the driver supply input of a corresponding driver supply circuit, and a high frequency AC current supply provides a high frequency AC output current to provide primary current to the current transformers via one or more cables magnetically coupled with the current transformer cores.

In certain embodiments, the supply provides the high frequency AC output current at a frequency greater than 100 kHz, such as 150 kHz in some embodiments. In certain embodiments, the current transformer-based driver supply techniques are used in an inverter output stage of an AC-DC-AC motor drive, where the initial AC-DC converter stage is a passive or active rectifier. In other embodiments, the active rectifier stage employs current transformers for powering the river circuitry. In certain embodiments, these techniques are used in both an active stage and in an inverter second stage.

In certain embodiments, the high frequency AC current supply includes a DC-AC converter, such as an inverter that generates the high frequency AC output current, as well as a diagnostic circuit that senses one or more voltages, currents, or other electrical condition of the high frequency AC current supply and selectively provides a diagnostic output signal or value to the switch control system of the motor drive.

In certain embodiments, the driver supply circuits include a driver rectifier converting the high frequency AC input current and having two output terminals providing a DC output current, as well as a regulator switch coupled across the output terminals and a comparator and switch driver circuit which is operative to selectively close the regulator switch to provide a current conduction path for the DC output current from the driver rectifier when the corresponding switch circuit is has low power demand.

A switch driver power supply system is disclosed for providing isolated power to actuate switching devices of an active power converter stage of a motor drive. The system includes a plurality of driver supply circuits individually associated with a corresponding switch circuit or a group of switch circuits of the active power converter stage, where the individual supply circuits are comprised of an AC driver supply input for receiving high frequency AC input current, a DC driver supply output for providing DC power to the corresponding switch circuit, and an AC-DC converter to provide DC output power to the DC driver supply output. The system also includes current transformers with a secondary winding to provide input current to a corresponding driver supply circuit. A high frequency AC current supply provides high frequency AC output current, such as above 100 kHz, e.g., 150 kHz in certain embodiments. One or more cables are coupled with an output of the high frequency AC current supply to conduct the high frequency AC output current as primary current of current transformers which provides high frequency AC input current to the driver supply circuits.

The high frequency AC current supply in certain embodiments includes a diagnostic circuit that senses an electrical condition of the high frequency AC current supply and selectively provides a diagnostic output signal or value. In certain embodiments, the high frequency AC current supply includes an AC-DC converter receiving AC power from an AC power source and providing a DC output to a DC-AC converter for generating the high frequency AC current. In some embodiments, moreover, the high frequency supply includes a harmonic filter circuit between the AC power source and the AC-DC converter, and the harmonic filter circuit corrects the power factor of the high frequency AC current supply. In certain embodiments, the individual driver supply circuits include a driver rectifier converting the high frequency AC input current and having two output terminals providing a DC output current, as well as a regulator switch coupled across the output terminals of the driver rectifier, and a comparator and switch driver circuit to selectively close the regulator switch to provide a current conduction path when the corresponding switch circuit has low power demand.

A method is provided for converting electrical power in a motor drive. The method includes providing high frequency AC current (e.g., above 100 kHz) to a cable magnetically coupled with cores of a plurality of current transformers to provide primary current to drive secondary windings thereof, converting current from the secondary windings to DC power, powering a plurality of switch circuits of a motor drive power converter stage using the DC power, and selectively activating the switch circuits to convert electrical power from a first form to a second form.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
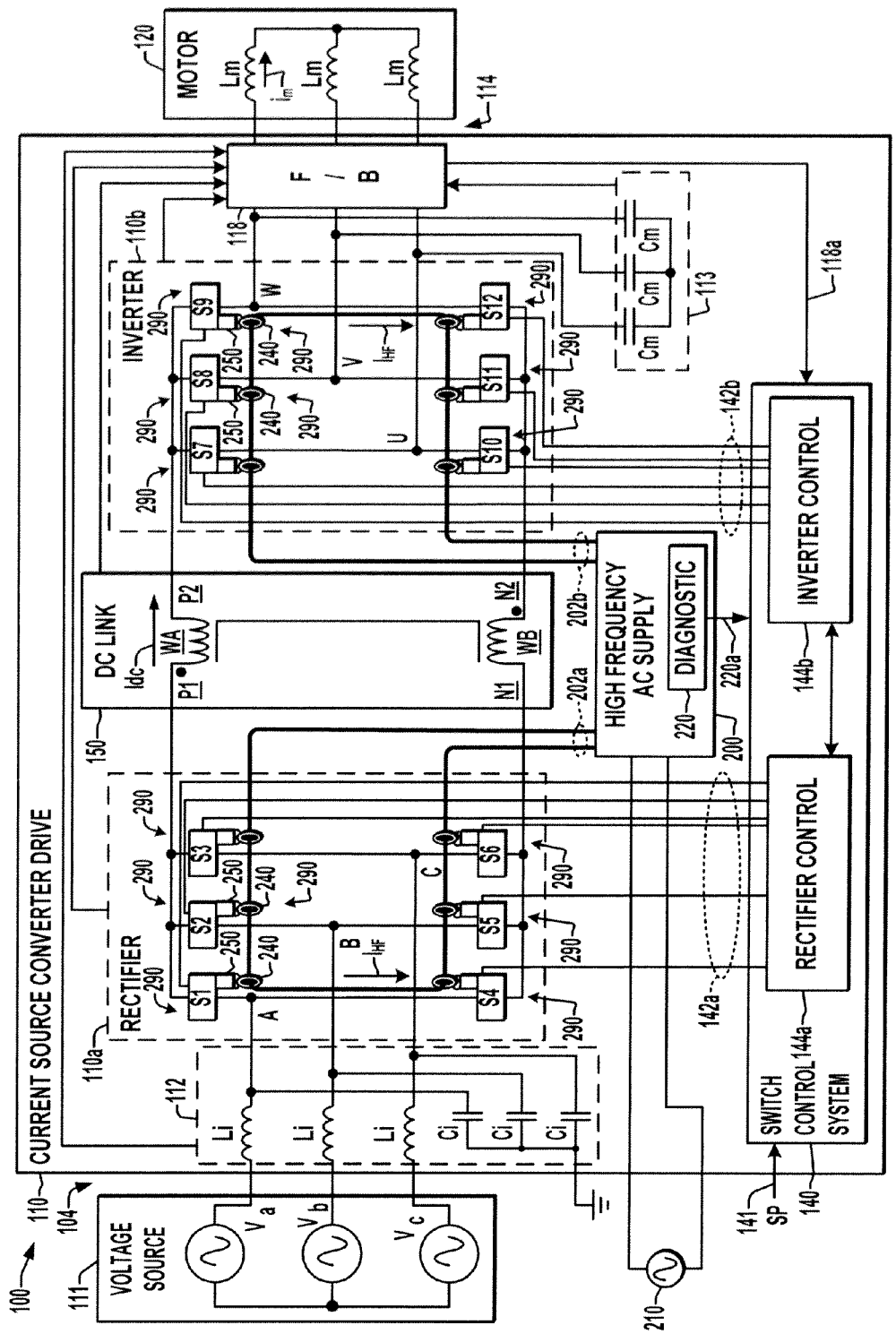
FIG. 1 is a schematic diagram illustrating an exemplary current source converter type variable frequency motor drive with a novel current loop isolated driver supply system having a high frequency AC current supply feeding local current transformers and associated AC-DC converters to provide switch driver power in accordance with one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale.

Referring initially to FIG. 1, an exemplary power conversion system 100 is illustrated, which includes a current source converter (CSC) type motor drive 110 driving a motor load 120. While illustrated in connection with a current source type converter 110, other embodiments are possible using a voltage source type converter 110. The system 100 includes an input 104 coupled with a three-phase AC voltage source 111 providing input power to the drive 110, and the drive 110 converts the input power to provide motor current $i_m$ to drive a motor load 120 having phase windings with associated inductances Lm coupled to a converter output 114. The drive 110 is a current source converter (CSC) type, with an input 112 connected to the AC power source 111. While these examples are illustrated as having a three phase input 112, other embodiments may provide a single phase AC input or may include a multiphase input adapted to receive three or more input phases. The CSC drive 110 in FIG. 1 provides variable frequency, variable amplitude single or multiphase AC output power at output terminals 114 to drive an AC motor load 120, which has three phase windings in the illustrated example. The output 114 in other embodiments may provide a single phase AC output or may be of any number of phases, and may power a load other than a motor, such as a power grid in a wind energy system, for example. The illustrated motor drive 110 includes both input filter capacitors Ci in the input circuit 112, as well as output filter capacitors Cm in an output filter circuit 113. The input filter capacitors Ci are coupled between corresponding input phase lines A, B, and C and an input neutral node. The output capacitors Cm are individually coupled between a corresponding output phase line U, V, and W and an output neutral node. Certain embodiments may omit either or both of the input or output filter capacitor sets. The input and output neutral nodes may be floating in certain embodiments, or one or both of the neutrals may be coupled to the ground of the input power source or to another ground. In still other possible embodiments, the neutrals may be coupled to one another directly or through an impedance without reference to any system ground. In the illustrated example, the node is grounded.

The drive 110 includes a rectifier 110a receiving the AC input power from the source 111 via an input 112, as well as an intermediate DC circuit 150 with a DC link choke having upper and lower windings, WA and WB, coupled between the rectifier 110a and an output inverter 110b. In certain embodiments, the DC link could be a simple DC link inductor or a common mode choke with windings in each of the upper and lower DC current paths as in the illustrated example. In other embodiments, a single link inductor could be provided in only one of the upper and lower DC current paths. In still other embodiments, the drive 110 could be a voltage source converter drive with an intermediate DC bus voltage established in the circuit 150, with a capacitance (single or multiple capacitors) connected between the upper and lower DC branches. The illustrated drive 110 provides input filtering including inductors Li in each input phase and input filter capacitors Ci coupled between the input lines A, B, C, and the input neutral node. The rectifier 110a is a current source rectifier (CSR) coupled with a current source inverter (CSI) 110b by the intermediate DC circuit 150, and one or more isolation components (e.g., transformers, not shown) may optionally be included in the drive 110. The output 114 provides AC electrical output power to the motor load 120 via lines U, V, and W, and includes filter circuit 113 with the output capacitors Cm coupled between the load 120 and the output neutral node.

The rectifier 110a is an active switching-type current source rectifier (CSR) with switching devices S1-S6 coupled between the input 112 and the DC circuit 150 and operates according to a plurality of rectifier switching control signals 142a provided by a rectifier control component 144a of a switch control system 140. In operation, the AC input power is switched by the rectifier switches S1-S6 to create an intermediate DC link current Idc in the intermediate circuit 150. The exemplary inverter 110b is a current source inverter (CSI) that includes switching devices S7-S12 coupled between the DC circuit 150 and phase lines U, V, and W of the output 114. The inverter switches S7-S12 are operated according to corresponding switching control signals 142b from an inverter control component 144h of the switch control system 140 to selectively convert DC power from the DC circuit 150 to provide the AC output power to drive the motor load 120.

In the intermediate DC (link) circuit 150, the DC link choke or inductor links the switches of the rectifier 110a and the inverter 110b, and provides forward and return current paths therebetween. The first winding WA of the link choke is coupled in a forward or positive DC path and has a first end P1 connected to the upper rectifier switches S1-S3 and a second end P2 coupled with the upper inverter switches S7-S9. The second (lower) winding WB is coupled in a negative or return DC path and has a first end N1 coupled to the lower rectifier switches S4-S6 as well as a second end N2 coupled to the lower inverter switches S10-S12.

The rectifier and inverter switching devices S1-S12 may be any suitable controllable electrical switch types (e.g., SGCTs, IGCTs, GTOs, thyristors, IGBTs, etc.) that are controlled according to any suitable type or form of switching scheme or schemes, such as phase control, pulse width modulation, etc., in open or closed-loop fashion. In certain embodiments, the switching devices S7-S12 of the inverter 110b are forced commutated devices including without limitation SGCTs, IGBTs or GTOs, and the switching devices S1-S6 of the rectifier 110a can be force commutated devices such as those mentioned above as well as line commutated devices such as Thyristors. In this regard, Thyristor devices could be used for the inverter switching devices S7-S12 in the form of forced commutated devices with extra circuitry added to the device triggering circuit, triggering circuit commutation.

The rectifier 110a and the inverter 110b operate under control of the switch control system 140, which may include one or more processors and associated memory as well as I/O circuits including driver circuitry for generating switching control signals 142 to selectively actuate the switching devices S1-S12 although separate switching control systems may be employed, for example, with interconnections and information sharing to facilitate the coordinated operation of the rectifier 110a and the inverter 110b. The switch control system 140 in these embodiments includes an inverter control component 144b providing the inverter switching control signals 142b to cause the inverter 110b to selectively convert DC current from the intermediate DC circuit 150 to provide AC electrical power to the AC output 114 according to one or more setpoints 141, such as desired motor speed, torque, etc.

The switch control system 140 and the components 144 thereof can be implemented as any suitable hardware, processor-executed software, processor-executed firmware, programmable logic, or combinations thereof, operative as any suitable controller or regulator by which the motor 120 is controlled according to one or more desired profile(s) or setpoint(s) 141, whether signals and/or digital values, in open or closed-loop fashion or combinations thereof.

In operation, moreover, a rectifier control component 44a of the controller 140 provides the rectifier switching control signals 142a to cause the rectifier 110a to convert AC electrical input power to provide a regulated DC current Idc to the DC circuit 150. In doing so, the rectifier controller 144a may employ one or more feedback signals or values 118a, such as a measured DC current value from the rectifier 110a representing the actual DC link current Idc and/or DC link voltage. The DC link current Idc from the rectifier 110a provides input current for conversion by the inverter 110b, where the exemplary inverter control 144b may provide a desired DC link current signal or value as a regulation setpoint to the rectifier controller 144a. In this manner, the rectifier 110a provides the DC current required by the inverter 110b, and the rectifier controller 144a may also implement other control functions such as power factor correction, while the inverter controller 144b performs the necessary motor control operation of the drive 110 according to one or more setpoint values or signals 141.

The drive 110 also includes a feedback system 118 including one or more sensing elements operative to provide one or more feedback signals and/or values 118a indicative of electrical conditions at the input 112, the rectifier 110a, the intermediate DC circuit 150, the inverter 110b, the output filter 113, and/or at the output 114. The switch control system 140 may be provided with one or more setpoints or desired values 141 and one or more feedback signals or values 118a from the feedback system 118 by which one or more closed loop motor drive control goals are achieved in normal motor drive operation. Feedback signals or values for the control functions can be based on signals and/or values 118a from the feedback system 118, measured input values (e.g., line voltages, neutral voltages, currents, etc.), and other information, data, etc., which may be in any suitable form such as an electrical signal, digital data, etc., and which may be received from any suitable source, such as one or more sensors, an external network, switches, a user interface associated with the system 100, or other suitable source(s). The feedback circuit 118 provides feedback signal(s) or value(s) to the controller 140 from at least one of the rectifier 110a, the DC circuit 150, and the inverter 110b, and may provide measured motor speed values through appropriate tachometers or other sensors, and/or sensed values from which motor speed, torque, current, and/or voltage, etc. may be determined by the controller 140. In this regard, sensorless motor speed feedback values may be generated internally by the controller 140 via suitable motor models based on the feedback signals or values 118a even for systems having no direct motor speed measurement sensors.

Figure 2:
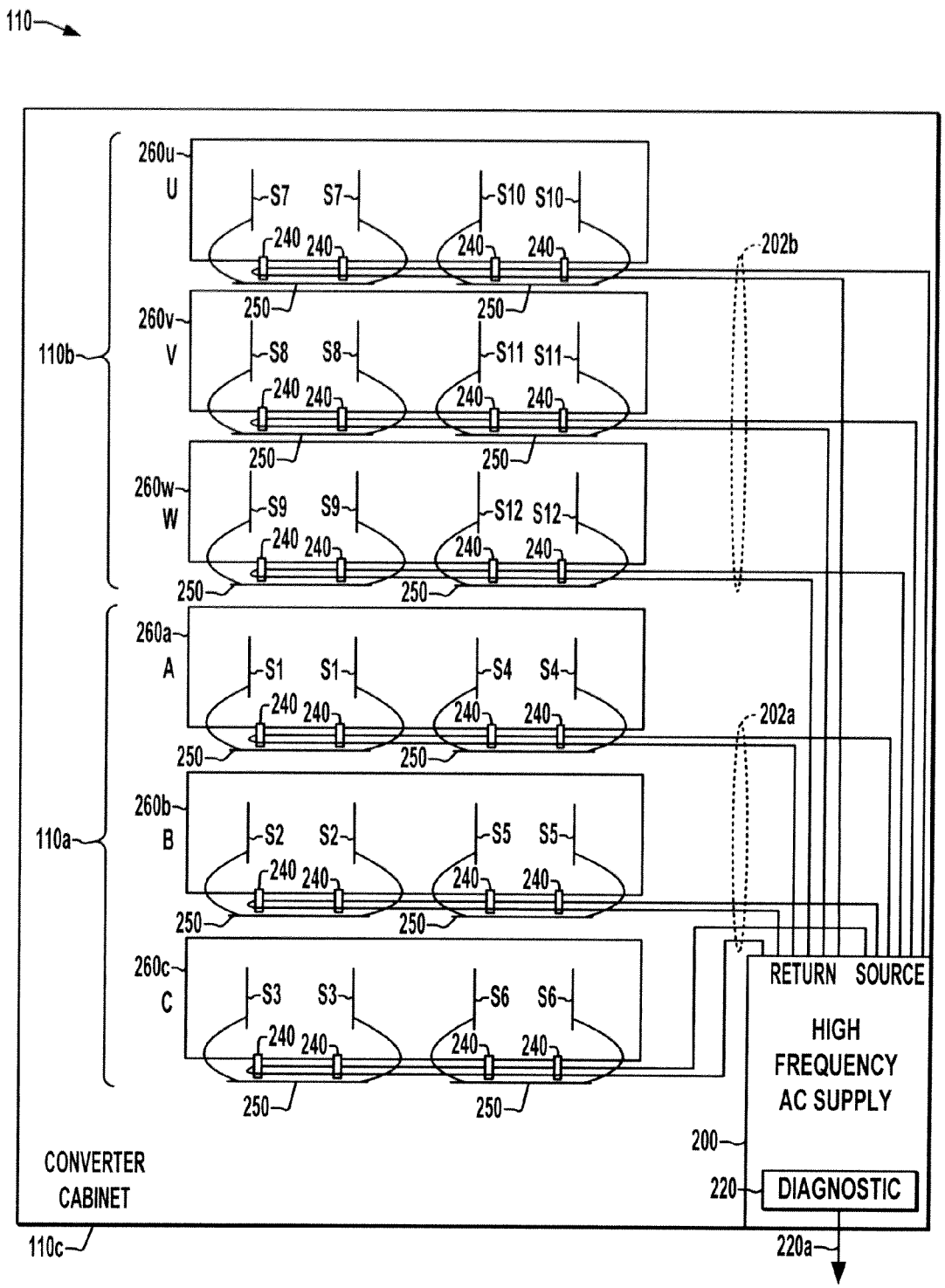
FIG. 2 is a schematic diagram illustrating an exemplary power converter cabinet with individual power cages for corresponding input and output phases having corresponding driver power converters and associated current transformers.
Figure 3:
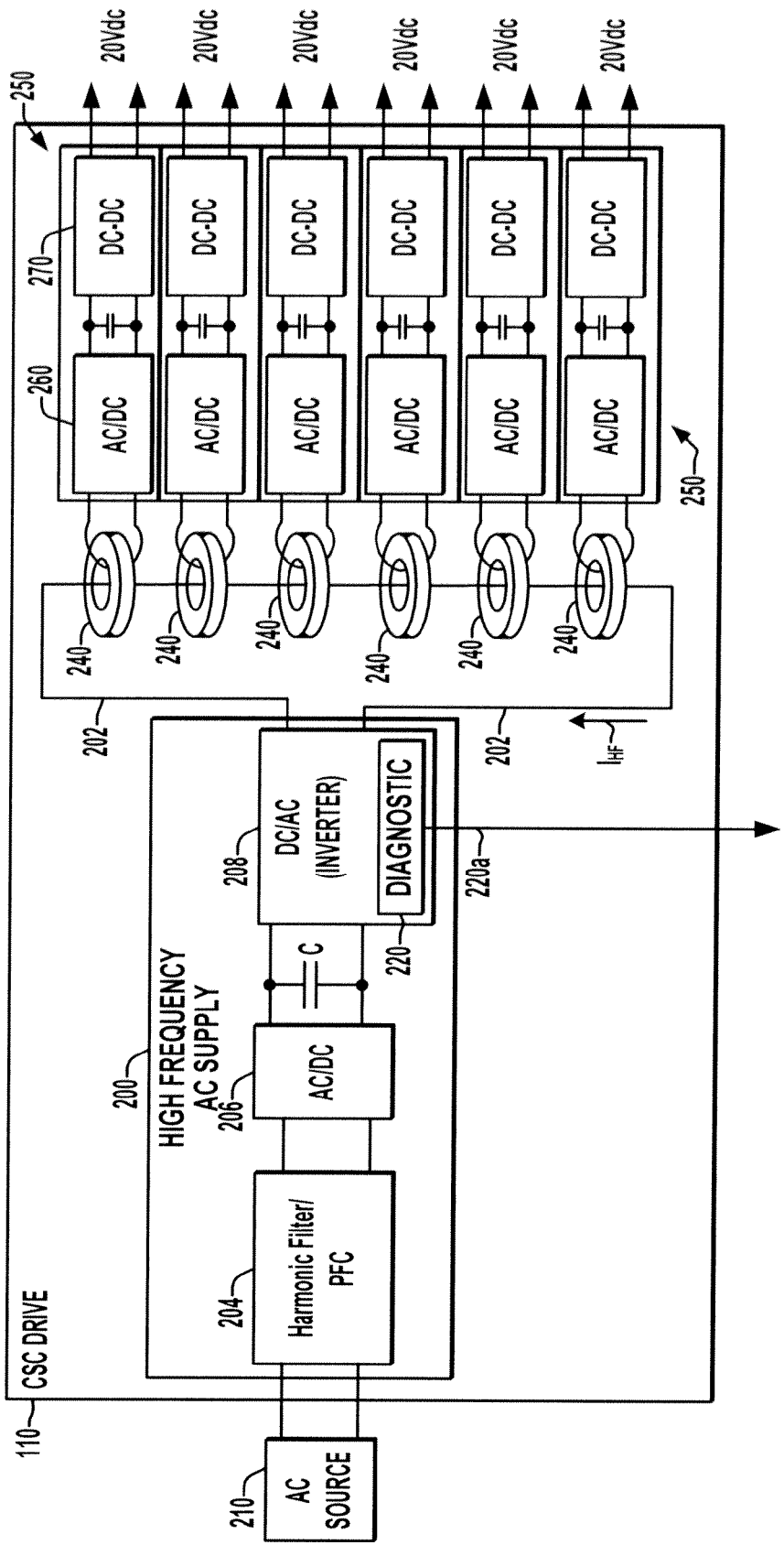
FIG. 3 is a schematic diagram illustrating an exemplary high frequency supply providing AC primary current to the driver power supply current transformers using a single cable in accordance with the disclosure.

In accordance with various aspects of the present disclosure, the drive 110 includes a switch driver power system to power the actuations of the switches S1-S12 (or individual groups of the switches S1-S6 or S7-S12 of the rectifier 110a and inverter 110b, respectively). As seen in FIGS. 1-3, the driver power system advantageously uses high frequency AC current $I_{HF}$ provided through one or more cables 202 that pass through cores of local driver current transformers 240, and the high frequency transformer secondary currents are converted to DC power for switch drivers 146 (FIG. 4) of the corresponding converter stage (110a and/or 110b). The driver power system uses this high frequency current approach to provide isolated power to actuate the switches S1-S12 in the embodiment of FIG. 1, but other embodiments can use this technique for only the inverter switches S7-S12 or just the rectifier switches S1-S6. In one particular embodiment, an active rectifier stage 110a uses self-powered switch drivers, such as those shown in U.S. Pat. No. 7,511,976 to Zargari et al. or in U.S. Pat. No. 7,576,451 to MacLennan et al., both of which patents are assigned to Rockwell Automation Technologies, Inc. of Mayfield Village, Ohio, the entireties of which are hereby incorporated by reference, with an active inverter stage 110b using drivers powered with high frequency current and current transformers 240 as described herein. In the illustrated embodiments, a high frequency AC current supply 200 provides high frequency AC output current $I_{HF}$ at a frequency above 100 kHz, such as about 150 kHz (e.g., +/−1%) in one implementation. The high frequency current is conducted through one or more current loop cables 202 having source and return portions which may be separately provided through current transformers 240 of the rectifier 110a and the inverter 110b as shown in FIGS. 1 and 2, and the at least one cable 202 may be further segmented as shown in FIG. 2 to provide a single loop cable 202 for each of a plurality of power cages 260a-260c for individual phases A-C of the input to the rectifier stage 110a and similar segmentation with respect to power cages 260u-260w corresponding to inverter output phases U, V, and W. Other possible segmentation may be implemented in other embodiments. It is noted in the example of FIG. 2 that the switching devices (e.g., S1) may be implemented as separate switches connected in series with one another, for example, to achieve a higher voltage, wherein separate or shared driver supplies 250 may be used. FIG. 3 illustrates another possible configuration in which a single cable 202 is used for powering driver supply circuits 250 for all six phases using current transformers 240.

Figure 4:
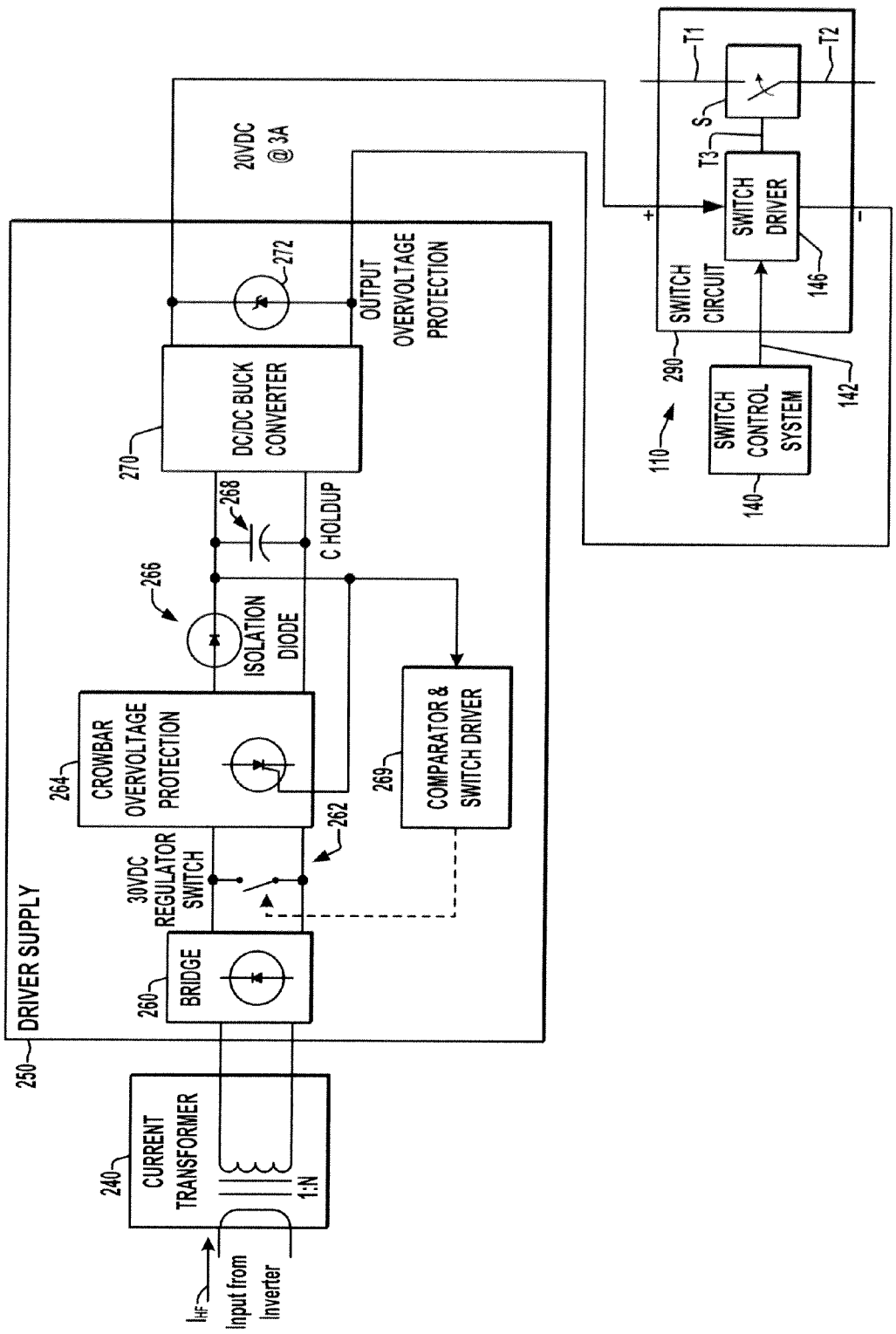
FIG. 4 is a schematic diagram illustrating further details of an exemplary driver power supply and a corresponding current transformer.

Referring also to FIG. 4, the exemplary switch driver power supply system includes driver supply circuits 250 individually associated with a corresponding switch circuit 290 or a group of switch circuits 290 (e.g., FIG. 2) of one or more of the converter stages 110a and 110b. As best shown in FIG. 4, the exemplary supply circuit 250 includes an AC driver supply input coupled with a secondary winding of the corresponding current transformer 240 to receive high frequency (secondary) AC input current, where the illustrated transformer 240 provides a turns ration of 1:N to provide secondary current based on the primary current $I_{HF}$ from the supply 200. The supply circuit 250 includes a DC driver supply output operatively coupled to provide DC power to the corresponding switch circuit 290 (or to a group of such switch circuits 290), as well as a rectifier bridge AC-DC converter circuit 260 which converts the high frequency AC input current to provide DC output power via two output terminals to the DC driver supply output. The example in FIG. 4 also includes a 30 VDC regulator switch 262 coupled across the output terminals of the driver rectifier 260, followed by a crowbar overvoltage protection circuit 264 and an isolation diode 266. The DC path in the exemplary supply 250 further includes a capacitor 268 followed by a buck type DC to DC converter stage 270 which provides a 20 VDC supply output rated at 3 A. The circuit 250 also provides overvoltage output protection via a zener diode 272, as well as a comparator and switch driver circuit 269 that monitors the voltage across the capacitor 268 and selectively closes the regulator switch 262 to connect the output terminals of the driver rectifier 260 when the corresponding switch circuit 290 has low power demand so as to provide a current conduction path for the DC output current from the driver rectifier 260. As further seen in FIG. 4, the 20 VDC supply is provided to a corresponding switch circuit 290 that includes a switch driver circuit 146 receiving the corresponding switching control signal 142 from the control system 140. The switch driver 146 is powered by the isolated 20 VDC supply from the circuit 250 and uses this power to selectively actuate the corresponding switching device S. The switch S includes first and second power terminals T1 and T2 and a control terminal T3, and the switch driver 146 operates the control terminal T3 according to the corresponding switching control signal 142 to selectively connect or disconnect the power terminals T1 and T2 to/from one another to perform the required power conversion in the converter stage 110a or 110b.

Figure 5:
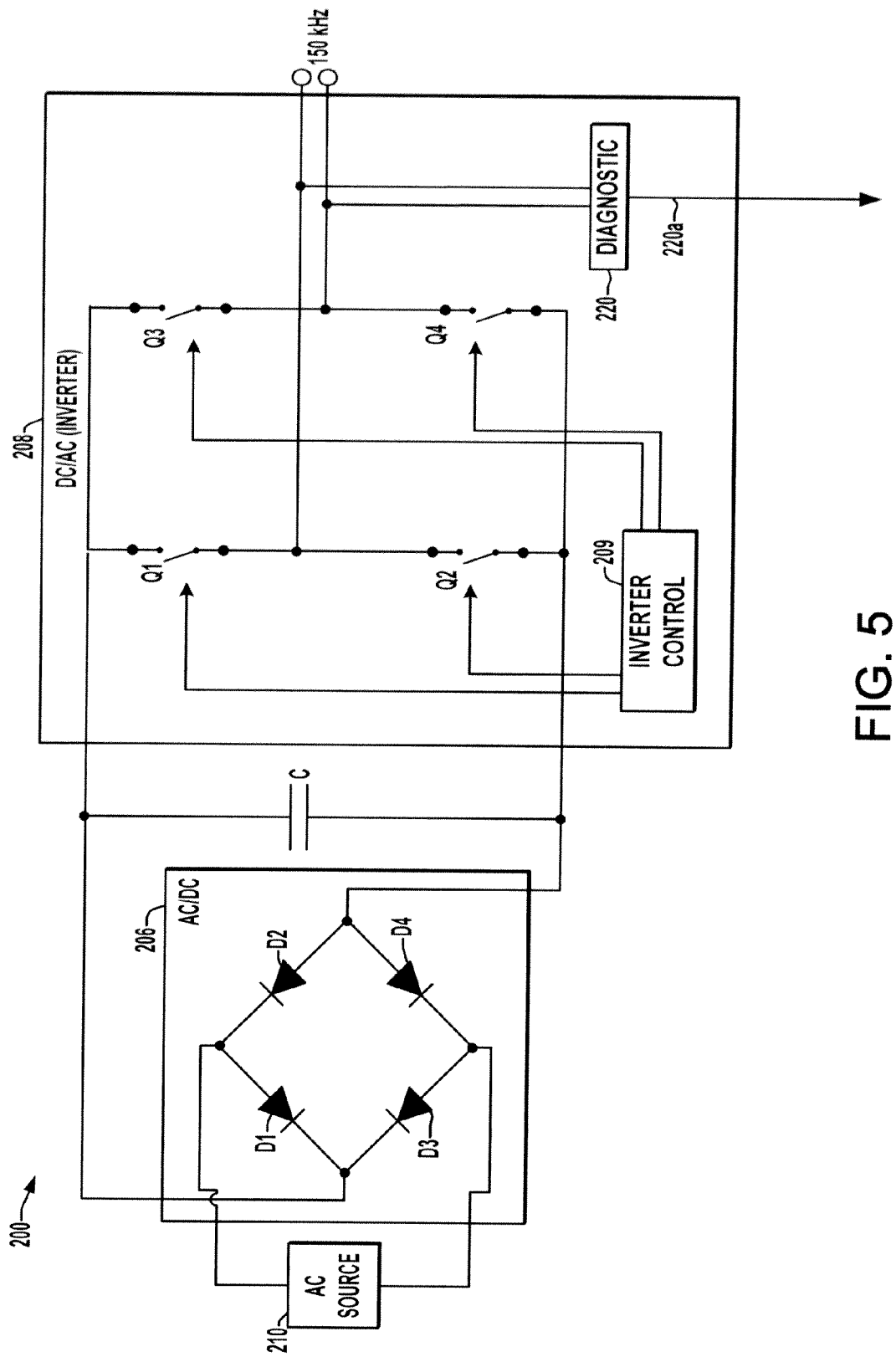
FIG. 5 is a schematic diagram illustrating further details of exemplary high frequency supply for providing AC primary current to the driver power supply current transformers in accordance with the disclosure.

Referring now to FIGS. 3 and 5, the system of FIG. 1 employs a single high frequency AC current supply 200, although two or more such current supplies 200 can be used in other embodiments. The exemplary high frequency supply 200 includes a full bridge rectifier 206 with diodes D1-D4 that receives input AC power (e.g., 120 VAC at 60 Hz in one embodiment) from an AC source 210 and provides a DC bus output with a filter capacitor C connected across the DC output terminals of the rectifier 206. As shown in FIG. 3, moreover, certain embodiments of the high frequency AC supply 200 may include a harmonic filter 204 coupled between the AC power source 210 and the AC-DC converter 206. In certain embodiments, moreover, the harmonic filter circuit 204 provides power factor correction functionality to correct or adjust the power factor of the high frequency AC current supply 200. The supply 200 further includes an inverter type DC to AC converter 208 which generates the high frequency current for powering the driver supply circuits 250. Any form of DC to AC conversion may be used. In the embodiment of FIG. 5, an inverter 208 is provided, including semiconductor-based switches Q1-Q4 (e.g., MOSFETs on one example) that are selectively actuated by control signals from an inverter controller 209, where the controller 209 may be a hardware circuit, with or without programmable logic or processor elements. The switches Q1-Q4 form an H-bridge inverter configuration supplied by the DC bus output from the rectifier bridge 206. The controller 209 in certain embodiments activates the switches Q1-Q4 to generate AC output currents at a frequency greater than about 100 kHz, such as about 150 kHz in certain implementations. In the illustrated embodiments, moreover, the high frequency supply 200 includes a diagnostic circuit 220 that senses the output voltage of the inverter 208 and detects significant changes therein to identify adverse conditions that may indicate failure or degradation of one or more components of the driver power supply system. Other embodiments are possible in which other electrical conditions of the high frequency AC current supply 200 are sensed by the diagnostic circuit 220, such as currents, voltages, frequencies, etc., by which potential failures or fault conditions can be determined or inferred. For instance, a sudden drop in the output voltage of the inverter 208 may be indicative of a failed switching device S1-S12 in the motor drive power conversion stages 110a, 110b, and/or a failed driver supply circuit 250 or failed current transformer 240, etc. When such an anomaly is sensed, the diagnostic circuit 220 provides a diagnostic output signal or value 220a to the switch control system 140 to indicate an adverse electrical condition of the high frequency AC current supply 200. Based on this, the controller 140 may be configured to report the event to another device or system and may take appropriate remedial or preventative action, such as a controlled shutdown of the drive 110.

The high frequency AC current supply 200 thus generates the high frequency AC output current $I_{HF}$ and provides this at one or more outputs connected to corresponding cable(s) 202. The cable 202 is preferably of sufficient current carrying capacity for a given driver supply situation, and preferably has sufficiently high insulation voltage rating to accommodate potential differences between the ground-based potential of the supply 210 and the voltages of the converter stage circuitry near the switch drivers 146. The cable(s) 202 is/are coupled with an output of the high frequency AC current supply 200 so as to conduct the current $I_{HF}$, and the cable 202 is operatively magnetically coupled with cores of the current transformers 240 to provide primary current to drive the secondary windings of the plurality of current transformers 240 to provide the high frequency AC input current to the plurality of driver supply circuits 250. For example, in the examples of FIGS. 1-3, the cables 202 pass through the current transformer cores 240 in order to operate as a primary winding thereto. Other magnetic coupling arrangements are possible, for example, in which the high frequency cable 202 makes one or more loops around a portion of a given current transformer core, or where the cable 202 does not pass through the core center, but instead is located proximate at least a portion of the core to magnetically couple the cable 202 with the transformer 240 to act as a primary winding for generating secondary currents to power the driver supply circuits 250. The driver circuits 250, in turn, are operatively coupled with single or grouped switch circuits 290 to provide DC power to the switch drivers 146.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A motor drive, comprising:
   an input receiving AC input electrical power from a power source;
   an output providing AC output electrical power to a motor load;
   at least one active power converter stage coupled between the input and the output and operative to convert electrical power from a first form to a second form, the at least one active power converter stage comprising:
   a converter stage input,
   a converter stage output, and
   a plurality of switch circuits coupled between the converter stage input and the converter stage output and operative according to a plurality of switching control signals to selectively couple the converter stage input and the converter stage output, with individual switch circuits comprising a switching device including a first power terminal, a second power terminal, and at least one control terminal, and a switch driver operating the at least one control terminal of the switching device according to a corresponding switching control signal to selectively connect or disconnect the first and second power terminals,
   a plurality of driver supply circuits individually associated with a corresponding switch circuit or a group of switch circuits, with individual driver supply circuits comprising an AC driver supply input operative to receive high frequency AC input current, a DC driver supply output operatively coupled with the corresponding switch circuit or a group of switch circuits to provide DC power to the switch drivers, and an AC-DC converter circuit operative to convert the high frequency AC input current to provide DC output power to the DC driver supply output, and
   a plurality of current transformers individually having a secondary winding coupled to provide high frequency AC input current to the AC driver supply input of a corresponding one of the plurality of driver supply circuits;
   a high frequency AC current supply operative to provide a high frequency AC output current;
   at least one cable coupled with an output of the high frequency AC current supply to conduct the high frequency AC output current, the at least one cable operatively magnetically coupled with cores of the plurality of current transformers to provide primary current to drive the secondary windings of the plurality of current transformers to provide the high frequency AC input current to the plurality of driver supply circuits; and
   a switch control system operatively coupled with the at least one active power converter stage to provide the plurality of switching control signals to the switch circuits to cause the at least one active power converter stage to convert electrical power from the first form to the second form.

2. The motor drive of claim 1, comprising:
   an intermediate circuit; and
   a rectifier operative to convert AC power from the input to provide DC power to the intermediate circuit;
   where the at least one active power converter stage is an inverter comprising a plurality of inverter switch circuits coupled with the intermediate circuit and with the output and operative according to a plurality of inverter switching control signals to selectively couple the intermediate circuit to the output; and
   where the switch control system includes an inverter control component operatively coupled with the inverter to provide the inverter switching control signals to the inverter to convert the DC power from the intermediate circuit to selectively provide the AC output electrical power to the motor load.

3. The motor drive of claim 2, where the rectifier is an active rectifier comprising a plurality of rectifier switching devices coupled with the input and with the intermediate circuit and operative according to a plurality of rectifier switching control signals to selectively couple the input to the intermediate circuit;

where the switch control system comprises a rectifier control component operatively coupled with the rectifier to provide rectifier switching control signals to the rectifier to cause the rectifier to convert input power from the power source to provide DC power to the intermediate circuit.

4. The motor drive of claim 3, where the active rectifier comprises:
a plurality of rectifier switch circuits coupled between the input and the intermediate circuit and operative according to the rectifier switching control signals to selectively couple the input and the intermediate circuit, with individual rectifier switch circuits comprising one of the rectifier switching devices including a first power terminal, a second power terminal, and at least one control terminal, and a switch driver operating the at least one control terminal of the rectifier switching device according to a corresponding rectifier switching control signal to selectively connect or disconnect the first and second power terminals;
a plurality of driver supply circuits individually associated with a corresponding rectifier switch circuit or a group of rectifier switch circuits, with individual driver supply circuits comprising an AC driver supply input operative to receive high frequency AC input current, a DC driver supply output operatively coupled with the plurality of rectifier switch circuits to provide DC power to the switch drivers, and an AC-DC converter circuit operative to convert the high frequency AC input current to provide DC output power to the DC driver supply output; and
a plurality of current transformers individually having a secondary winding coupled to provide high frequency AC input current to the AC driver supply input of a corresponding one of the plurality of driver supply circuits;
where the at least one cable is operatively magnetically coupled with cores of the plurality of current transformers of the active rectifier to provide primary current to drive the secondary windings of the plurality of current transformers of the active rectifier to provide the high frequency AC input current to the plurality of driver supply circuits of the active rectifier.

5. The motor drive of claim 1, where the high frequency AC current supply comprises:
a DC-AC converter operative to provide the high frequency AC output current to the at least one cable; and
a diagnostic circuit operative to sense at least one electrical condition of the high frequency AC current supply and to selectively provide a diagnostic output signal or value to the switch control system, the diagnostic output signal or value being indicative of an adverse electrical condition of the high frequency AC current supply.

6. The motor drive of claim 1, where the high frequency AC current supply provides the high frequency AC output current at a frequency greater than 100 kHz.

7. The motor drive of claim 1, where the individual driver supply circuits comprise:
a driver rectifier converting the high frequency AC input current and having two output terminals providing a DC output current;
a regulator switch coupled across the output terminals of the driver rectifier; and
a comparator and switch driver circuit operative to selectively close the regulator switch to connect the output terminals of the driver rectifier to provide a current conduction path for the DC output current from the driver rectifier when the corresponding switch circuit has low power demand.

8. A switch driver power supply system for providing isolated power to actuate switching devices of an active power converter stage of a motor drive, the switch driver power supply system comprising:
a plurality of driver supply circuits individually associated with a corresponding switch circuit or a group of switch circuits of the active power converter stage; individual driver supply circuits comprising:
an AC driver supply input operative to receive high frequency AC input current,
a DC driver supply output operatively coupled to provide DC power to the corresponding switch circuit or a group of switch circuits, each switch circuit including a switch driver circuit powered by the driver supply output to selectively actuate a corresponding switching device, and
an AC-DC converter circuit operative to convert the high frequency AC input current to provide DC output power to the DC driver supply output;
a plurality of current transformers individually having a secondary winding coupled to provide high frequency AC input current to the AC driver supply input of a corresponding one of the plurality of driver supply circuits;
a high frequency AC current supply operative to provide a high frequency AC output current; and
at least one cable coupled with an output of the high frequency AC current supply to conduct the high frequency AC output current, the at least one cable operatively magnetically coupled with cores of the plurality of current transformers to provide primary current to drive the secondary windings of the plurality of current transformers to provide the high frequency AC input current to the plurality of driver supply circuits.

9. The switch driver power supply system of claim 8, where the high frequency AC current supply provides the high frequency AC output current at a frequency greater than 100 kHz.

10. The switch driver power supply system of claim 9, where the high frequency AC current supply provides the high frequency AC output current at a frequency of about 150 kHz.

11. The switch driver power supply system of claim 8, where the high frequency AC current supply comprises a DC-AC converter operative to provide the high frequency AC output current to the at least one cable, and an AC-DC converter receiving AC power from an AC power source and providing a DC output to the DC-AC converter.

12. The switch driver power supply system of claim 11, where the high frequency AC current supply comprises a harmonic filter circuit coupled between the AC power source and the AC-DC converter, and where the harmonic filter circuit corrects a power factor of the high frequency AC current supply.

13. The switch driver power supply system of claim 8, where the individual driver supply circuits comprise:
a driver rectifier converting the high frequency AC input current and having two output terminals providing a DC output current;
a regulator switch coupled across the output terminals of the driver rectifier; and
a comparator and switch driver circuit operative to selectively close the regulator switch to connect the output terminals of the driver rectifier to provide a current conduction path for the DC output current from the driver rectifier when the corresponding switch circuit has low power demand.

14. A switch driver power supply system for providing isolated power to actuate switching devices of an active power converter stage of a motor drive, the switch driver power supply system comprising:
    a plurality of driver supply circuits individually associated with a corresponding switch circuit or a group of switch circuits of the active power converter stage; individual driver supply circuits comprising:
        an AC driver supply input operative to receive high frequency AC input current,
        a DC driver supply output operatively coupled to provide DC power to the corresponding switch circuit or a group of switch circuits, and
        an AC-DC converter circuit operative to convert the high frequency AC input current to provide DC output power to the DC driver supply output;
    a plurality of current transformers individually having a secondary winding coupled to provide high frequency AC input current to the AC driver supply input of a corresponding one of the plurality of driver supply circuits;
    a high frequency AC current supply operative to provide a high frequency AC output current; and
    at least one cable coupled with an output of the high frequency AC current supply to conduct the high frequency AC output current, the at least one cable operatively magnetically coupled with cores of the plurality of current transformers to provide primary current to drive the secondary windings of the plurality of current transformers to provide the high frequency AC input current to the plurality of driver supply circuits,
    where the high frequency current supply comprises:
        a DC-AC converter operative to provide the high frequency AC output current to the at least one cable; and
        a diagnostic circuit operative to sense at least one electrical condition of the high frequency AC current supply and to selectively provide a diagnostic output signal or value to the switch Control system, the diagnostic output signal or value being indicative of an adverse electrical condition of the high frequency AC current supply.

15. The switch driver power supply system of claim 14, where the high frequency AC current supply provides the high frequency AC output current at a frequency greater than 100 kHz.

16. The switch driver power supply system of claim 14, where the high frequency AC current supply provides the high frequency AC output current at a frequency of about 150 kHz.

17. The switch driver power supply system of claim 14, where the high frequency AC current supply comprises an AC-DC converter receiving AC power from an AC power source and providing a DC output to the DC-AC converter.

18. The switch driver power supply system of claim 17, where the high frequency AC current supply comprises a harmonic filter circuit coupled between the AC power source and the AC-DC converter, and where the harmonic filter circuit corrects a power factor of the high frequency AC current supply.

19. A method for converting electrical power in a motor drive, the method comprising:
    providing high frequency AC current to at least one cable magnetically coupled with cores of a plurality of current transformers to provide primary current to drive secondary windings of the plurality of current transformers;
    converting secondary current from the secondary windings of the plurality of current transformers to provide isolated DC power;
    powering switch drivers of a plurality of switch circuits of an active power converter stage of the motor drive using the isolated DC power; and
    selectively activating switch control terminals of the plurality of switch circuits using the corresponding switch driver to convert electrical power from a first form to a second form.

20. The method of claim 19, where the high frequency AC current is provided to the at least one cable at a frequency greater than 100 kHz.

* * * * *